United States Patent
Kang et al.

(10) Patent No.: US 7,127,364 B2
(45) Date of Patent: Oct. 24, 2006

(54) METHOD OF COMPENSATING FOR DISTORTED SECONDARY CURRENT OF CURRENT TRANSFORMER

(75) Inventors: Sang Hee Kang, Seoul (KR); Dong Gyu Lee, Seoul (KR); Seung Ho Hyun, Goyang-si (KR); Yong Cheol Kang, Jeonju-si (KR)

(73) Assignee: Myongji University, Seoul (KR)

( * ) Notice: Subject to any disclaimer, the term of this patent is extended or adjusted under 35 U.S.C. 154(b) by 0 days.

(21) Appl. No.: 11/010,747

(22) Filed: Dec. 13, 2004

(65) Prior Publication Data

US 2005/0094344 A1 May 5, 2005

(30) Foreign Application Priority Data

Oct. 11, 2004 (KR) .............. 10-2004-0080844

(51) Int. Cl.
*G01R 19/00* (2006.01)
*G06F 19/00* (2006.01)

(52) U.S. Cl. .............. 702/64; 702/58; 702/65

(58) Field of Classification Search .......... 702/57, 702/58, 60, 64, 65, 85, 182, 185; 323/356–358; 361/146, 149, 267
See application file for complete search history.

(56) References Cited

U.S. PATENT DOCUMENTS 6,160,697 A * 12/2000 Edel .............. 361/143

6,479,976 B1 * 11/2002 Edel .............. 323/357
2005/0140352 A1 * 6/2005 Allain et al. .............. 323/357

FOREIGN PATENT DOCUMENTS

WO    WO 02/093183 A1    11/2002

OTHER PUBLICATIONS

M. Kezunovic et al; "Experimental Evaluation of EMTP-Based Current Transformer Models for Protective Relay Transient Study"; *IEEE Transactions on Power Delivery*, vol. 9, No. 1, Jan. 1994 (pp. 405-413).

* cited by examiner

*Primary Examiner*—Bryan Bui
(74) *Attorney, Agent, or Firm*—The Webb Law Firm

(57) ABSTRACT

Disclosed herein is a method of compensating for the distorted secondary/ current of a current transformer. The method includes steps (a), (b) and (c). At step (a), the saturated section of the current transformer is detected. At step (b), fault current generated during a fault in a power system is represented using an AutoRegressive (AR) model, with the fault current being assumed to be a combination of a Direct Current (DC) offset component, a fundamental wave component and harmonic components. At step (c), coefficients of the AR model are estimated and the secondary current during saturation of the current transformer is compensated, based on the secondary current data sampled in the unsaturated section.

19 Claims, 10 Drawing Sheets

PRIOR ART

PRIOR ART

METHOD OF COMPENSATING FOR DISTORTED SECONDARY CURRENT OF CURRENT TRANSFORMER

BACKGROUND OF THE INVENTION

1. Field of the Invention

The present invention relates generally to a method of compensating for the distorted secondary current of a current transformer and, more particularly, to a method of compensating for distorted secondary current in the case where secondary current is distorted due to saturation caused by the magnetic characteristics of a steel core current transformer.

2. Description of the Related Art

A current transformer is a device for reducing the magnitude of current and inputting it to a protective relay. In order to maximize the linkage of primary and secondary windings, a steel core current transformer is generally used.

FIG. 1 is a diagram showing the configuration of a typical current transformer. Referring to FIG. 1, the current transformer includes a steel core 14 for condensing magnetic flux generated by primary current flowing through an electrical line 12, and a secondary coil 16 surrounding the steel core 14 to generate secondary current using the magnetic flux induced to the steel core 14.

FIG. 2 is a schematic diagram showing the equivalent circuit of the typical current transformer of FIG. 1. In FIG. 2, L is the magnetizing inductance of the current transformer, $i_m$ is magnetizing current, $i_{2'}$ is secondary current in conformity with a current transformation ratio, and $i_2$ is secondary current actually measured. In this case, the magnetizing inductance L is not a constant value, but is a value that varies according to current. When magnetic flux increases and exceeds a specific limit, magnetizing inductance varies significantly, which is attributable to the variation in the internal state of a current transformer. In this case, it is stated that the current transformer has been saturated.

Since the magnitude of magnetizing current $i_m$ is small when a current transformer operates normally, the measured secondary current value of the current transformer is proportional to primary current value, so that there is no problem. However, when the current transformer is saturated and the magnetizing inductance value of the current transformer varies significantly, the secondary current value of the current transformer varies significantly. That is, when the current transformer is saturated, the value L decreases significantly and the magnetizing current $i_m$ increases, $i_{2'}$ and $i_2$ become different from each other. Accordingly, before and after the saturation of the current transformer, the relationship between finally measured secondary current $i_2$ and primary current varies, so that the saturation of the current transformer delays the operational time of a relay and causes the mal-operation of the relay.

As described above, the steel core current transformer cannot avoid saturation due to the magnetic characteristics thereof. In this case, the secondary current passed through the current transformer is distorted, so that it is impossible to obtain information on the primary side of a system. As a result, the saturation of the current transformer causes the mal-operation or non-operation of a relay, reduces the sensitivity of a relay and delays the operational time of a relay, so that countermeasures against this problem should be provided.

A typical method for minimizing the influence of the saturation of a current transformer on a relay is to employ a current transformer having a voltage rating that is two times higher than the maximum fault current. However, even when the method is employed, there is a possibility of saturation due to the influence of a current offset component and remanent magnetic flux in the steel core. Accordingly, when the expected fault current is large, the cross section of the steel core should be large, so that disadvantages arise in that the size and cost of a current transformer increase.

For the countermeasures against the saturation of a current transformer, research into methods of compensating for secondary current distorted due to the saturation of the current transformer has been conducted.

One of the proposed methods is a method of estimating precise secondary current by estimating remanent magnetic flux and calculating magnetizing current using the magnetization curve of a current transformer. However, this method is disadvantageous in that error becomes larger if remanent magnetic flux exists at the time of the occurrence of a fault because remanent magnetic flux in an early stage is assumed to be zero.

Another of the proposed methods is a method of increasing the precision of a current transformer by estimating the magnetic flux of a steel core in an early stage and estimating exciting current using a hysteresis curve. However, this method is disadvantageous in that it is effective only in the case where the primary current of a current transformer has a sine waveform that does not include a Direct Current (DC) offset component, and it requires precise current transformer magnetization curve data.

SUMMARY OF THE INVENTION

Accordingly, the present invention has been made keeping in mind the above problems occurring in the prior art, and an object of the present invention is to provide a method of compensating for the distorted secondary current of a current transformer, which can detect the saturation of the current transformer in real time using current information and compensate for the distorted secondary current even in the case where the remanent magnetic flux of the current transformer exists.

In order to accomplish the above object, the present invention provides a method of compensating for the distorted secondary current of a current transformer, the method including the steps of (a) detecting the saturated section of the current transformer; (b) representing fault current generated during a fault in a power system using an AutoRegressive (AR) model, with the fault current being assumed to be a combination of a DC offset component, a fundamental wave component and harmonic component; and (c) estimating coefficients of the AR model and compensating precisely the secondary current during the saturation of the current transformer, based on the secondary current data sampled in the unsaturated section.

Step (a) may be to detect the saturated section of the current transformer using a wavelet transform, and may be performed in such a way as to detect the saturated section of the current transformer using high-pass filter output after passing the secondary current of the current transformer through a filter bank.

Step (a) may be to detect the saturated section of the current transformer using a second- or higher-order difference of the current transformer.

The AR model may be expressed in the following (2m+1)-th-order form in consideration of a DC offset component decreasing exponentially, a fundamental wave component and second to m-th harmonic components.

$$i[k+1] = \Phi^T(k)\theta$$

where $\Phi(k) = (k) = [i[k], i[k1], \ldots, i[k-2m]]^T$, $\theta = [\theta_1, \theta_2, \ldots, \theta_{2m+1}]^T$, $i[k]$ is the current value sampled at present time, $i[k-1]$ is the current value sampled one sampling interval before, $i[k-2m]$ is the current value sampled $2m$ sampling intervals before, $\theta$ is the coefficient of the AR model, and m is an arbitrary natural number.

The plurality of pieces of sampled secondary data may include values sampled after the saturation of the current transformer.

The AR model allows the following matrix equation to be derived therefrom.

$$Y(k) = \Phi(k)\hat\theta$$

where $Y(k) = [i[k], i[k-1], \ldots, i[k-L+1]]^T$, $\Phi(k) = [\Phi^T(k-1), \Phi^T(k-2), \ldots, \Phi^T(k-L)]^T$, $\hat\theta = [\theta_1, \theta_2, \ldots, \theta_{2m+1}]^T$, and L is a natural number.

The coefficient of the AR model is preferably calculated using the following equation.

$$\hat\theta(k) = [\Phi^T(k)\Phi(k)]^{-1}\Phi^T(k)Y(k)$$

Meanwhile, the n-th harmonic sine component of the AR model is expressed by the following Equation, $$x_n[k+1] = (2-(n\omega T)^2)x_n[k] - x_n[k-1]$$

where $n\omega$ is a frequency, T is a sampling interval, $x_n[k]$ is the current value of an n-th harmonic sine component sampled at present time, and $x_n[k-1]$ is the current value of an n-th harmonic sine component sampled one sampling interval before.

Furthermore, the DC offset component of the AR model, which decreases exponentially, may be expressed by the following Equation, $$x_0[k+1] = (1-T/\tau)x_0[k]$$

where $\tau$ is a time constant.

Preferably, the coefficient of the AR model is previously calculated using the frequency $n\omega$, the sampling interval T and an equivalent power time constant behind the installation point of a relay.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
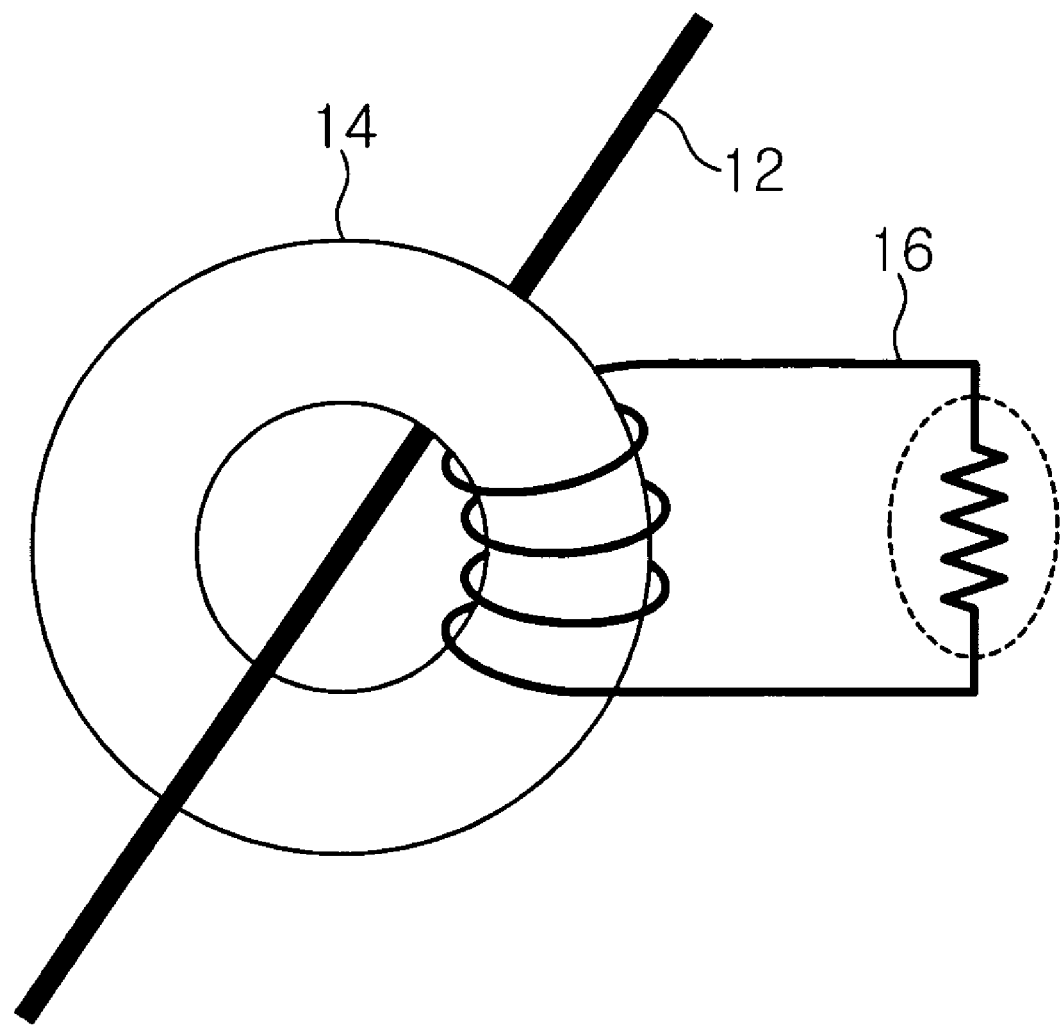
FIG. 1 is a diagram showing the configuration of a typical current transformer.
Figure 2:
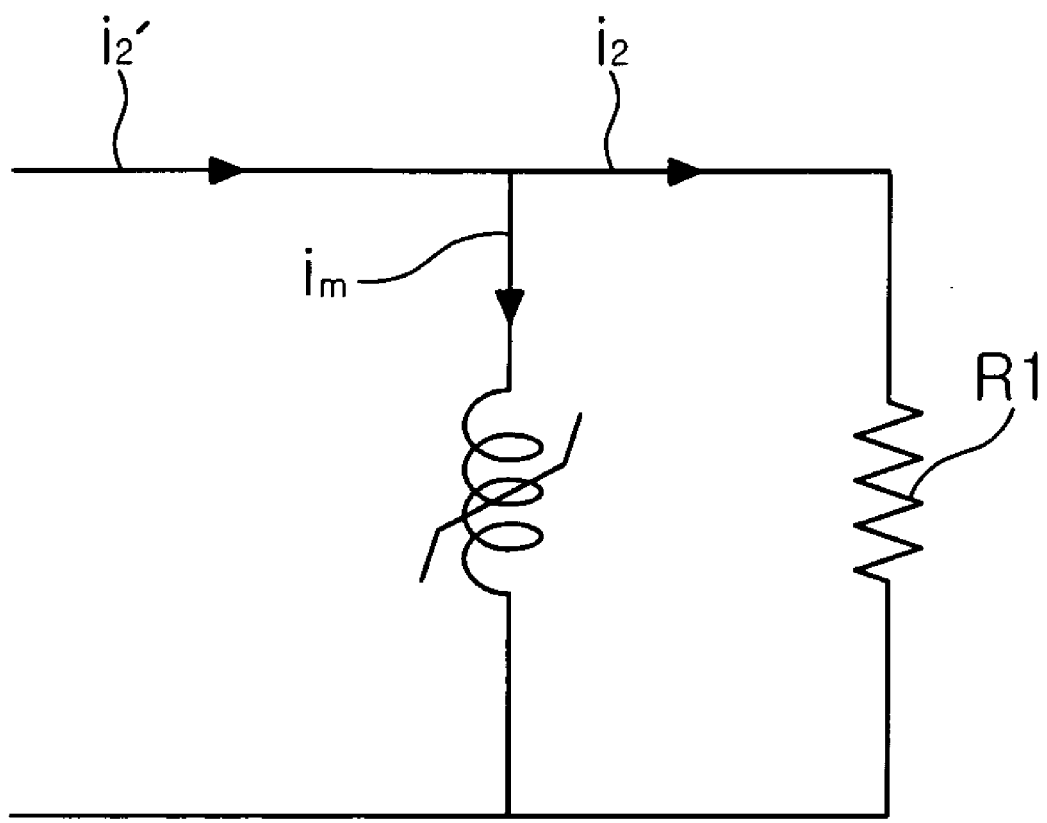
FIG. 2 is a schematic diagram showing the equivalent circuit of the typical current transformer of FIG. 1.

Reference now should be made to the drawings, in which the same reference numerals are used throughout the different drawings to designate the same or similar components.

Figure 3:
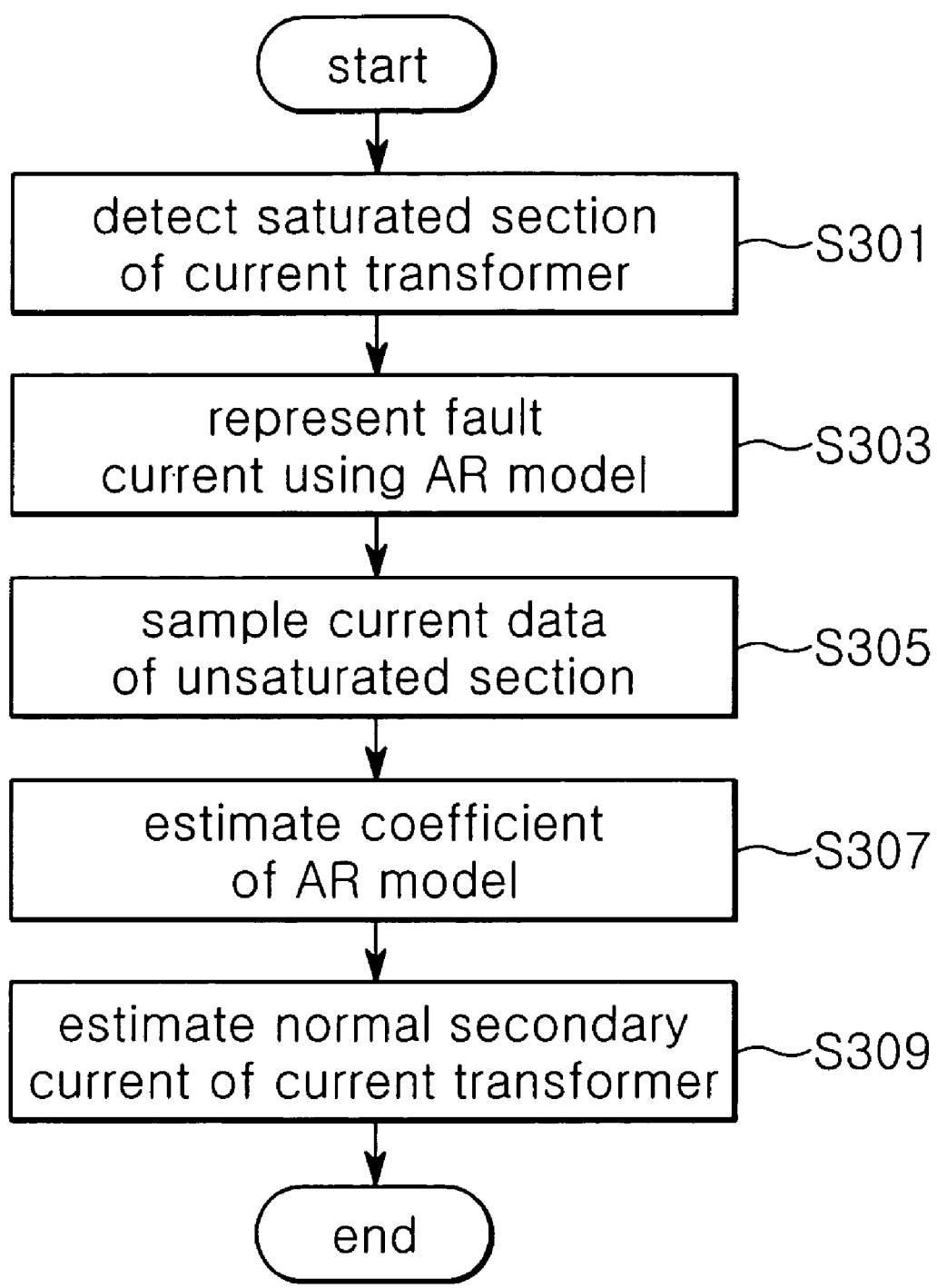
FIG. 3 is a flowchart showing a method of compensating for the distorted secondary current of a current transformer in accordance with the present invention.

FIG. 3 is a flowchart showing a method of compensating for the distorted secondary current of a current transformer in accordance with the present invention.

Referring to FIG. 3, in the method of compensating for the distorted secondary current of a current transformer, if the secondary current is distorted due to the saturation of the current transformer, the saturated section of the current transformer is detected at step S301.

A method of detecting the saturated section includes a method using a wavelet transform, a method using the output of a high-pass filter and a method using the second- or higher-order difference of the secondary current of a current transformer.

A wavelet transform is a part of analytics, and is closely related to signal processing and image processing. Meanwhile, a Fourier transform, that is, a typical technique of analyzing signals, is a technique that transforms values represented as a function of time into a function of frequency. That is, the Fourier transform is a method of obtaining the magnitude of each sine wave, with a signal varying with time being considered a plurality of overlapped sine waves having different frequencies. This method is especially useful to analyze an electrical signal in which a plurality of sine waves having different frequencies are mixed with each other, or is used to reduce noise by removing only a signal having an undesired frequency component.

The wavelet transform can be considered a developed type of Fourier transform. Compared to the Fourier transform that finds a relationship while varying only a frequency using a sine wave, which repeats infinitely, as a fundamental waveform, the wavelet transform is a technique that finds a relationship while varying the magnitude and position of a basic waveform using a waveform, which corresponds to a single wavelength, as the basic waveform. In this case, the variation of the magnitude is identical to the variation of the frequency in the Fourier transform, while the variation of the position is a unique technique in the wavelet transform.

The Fourier transform is disadvantageous in that a single wave repeating infinitely is used as a fundamental waveform, so that time information vanishes when the values represented as a function of time are transformed into a function of frequency. That is, it can be found which frequency component is dominant, but it cannot be found where the frequency component appears temporally. In contrast, the wavelet transform is advantageous in that time information as well as frequency information can be found because the waveform of a single wavelength varies in magnitude and position. When a single signal is analyzed using a Fourier series, the signal is represented on a three-dimensional graph that is formed by frequency and amplitude axes.

The above theoretical wavelet transform cannot be implemented in real time, so that the saturated section of a current transformer may be detected in real time using a filer bank. That is, in order to implement a wavelet transform in real time, the secondary current of the current transformer may be passed through the filter bank and the saturated section of the current transformer may be detected using the output of the high-pass filter of the filter bank.

Figure 4:
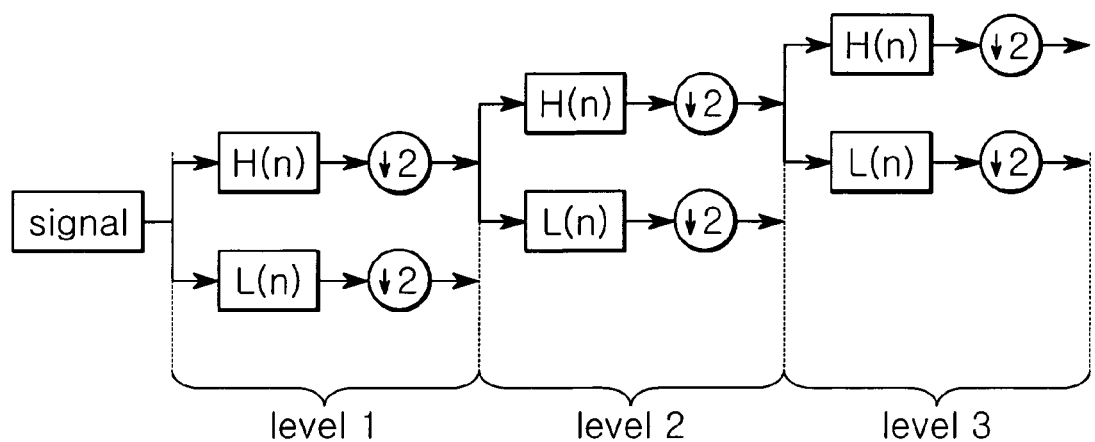
FIG. 4 is a diagram showing an example of a wavelet transform using a filter bank.

FIG. 4 is a diagram showing an example of a wavelet transform using a filter bank, which shows an example of performing a Discrete Wavelet Transform (DWT) using a Quadrature Mirror Filter (QMF) bank having a 3-level tree structure.

Referring to FIG. 4, an input signal is dissolved into a high-frequency component signal H(n) and a low-frequency component signal L(n) in a level 1. The filtered signals, that is, discrete time signals filtered by a digital filter, are each down-sampled by ½. In other words, one of the two sample values is removed from the filtered discrete time signals. In this case, in the method of compensating for the distorted secondary current of a current transformer, it is profitable to the determination of whether the current transformer is saturated to extract and use a high-order component. Accordingly, it is preferable to extract and use the high-frequency component signal H(n) of the sample values.

The above-described process is repeated in levels 2 and 3. As a result, an original signal is dissolved into a plurality of sub-band components. A classical short-section Fourier transform is fundamentally different from the wavelet transform in that the section Fourier transform employs the same size window for all the frequency bands, while the wavelet transform employs a narrow window for high-frequency bands and a wide window for low-frequency bands. Accordingly, a wavelet analysis is referred to as a "constant relative bandwidth analysis," in which case the variation width of a frequency band is always proportional to a frequency value.

A method using the second- or higher-order difference of the secondary current of a current transformer may be employed as the method of detecting the saturated section of the current transformer.

Figure 5:
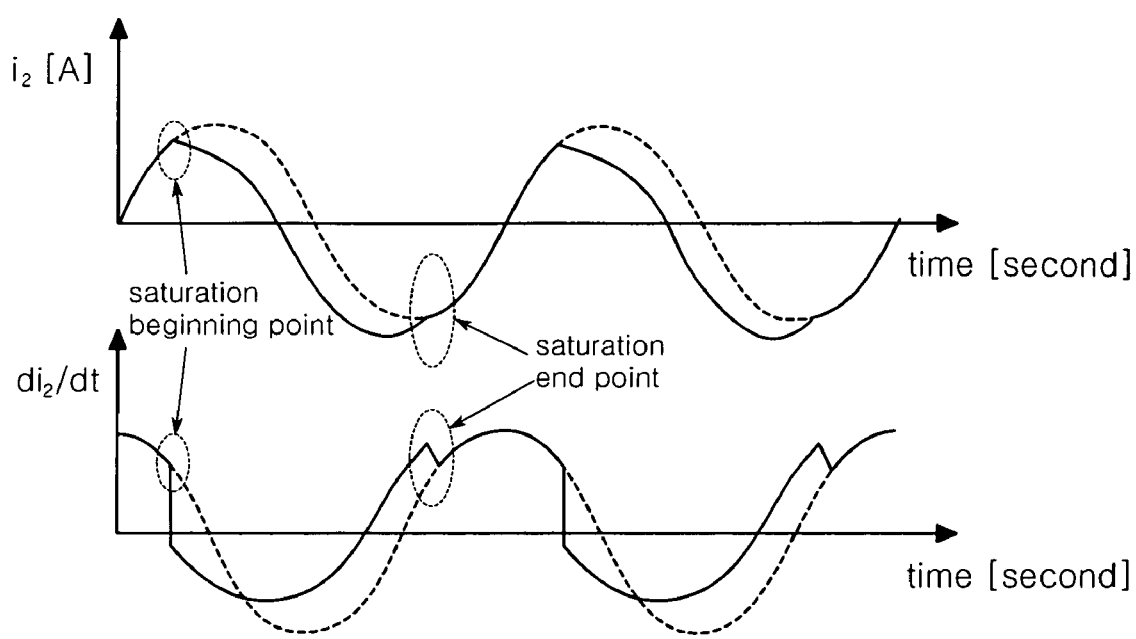
FIG. 5 depicts graphs schematically showing the variation and first-order differentiation of secondary current during the saturation of a current transformer.

FIG. 5 depicts graphs schematically showing the variation and first-order differentiation of secondary current during the saturation of a current transformer. Referring to FIG. 5, when the current transformer is saturated, the waveform of secondary current varies due to the variation in the internal state of a steel core, and points of discontinuity appear as shown in FIG. 5 when first-order differentiation is performed on the waveform of the secondary waveform. When second-order differentiation is performed on the secondary current, variation is large at the points of discontinuity. In most cases, when second- or higher-order differentiation is used, the points may be distinguished from other parts. In the present invention, using the above-described principle, the beginning and end of saturation are detected. If the detection of the beginning and end of saturation is performed using a computer, data can be quickly processed, so that it can be precisely determined whether the variation in secondary current is caused by an accident or saturation. When, to perform such computations using a computer, the above first- or higher-order differentiation is performed using dis- crete data, it is apparent to those skilled in the art that many generally known numerical differentiation methods or their simple arithmetic variations can be applied.

A method of determining whether a current transformer is saturated, which is disclosed in PCT Appl. No. PCT/KR2001/00809 (International filing date: May 17, 2001), may be employed as the method of detecting the beginning and end of saturation of a current transformer. According to the this method, when it is assumed that the discrete equation of the secondary current of a current transformer is $i_2[n]$, $del1[n]$ is the difference of secondary current and is expressed by Equation 1.

$$del1[n]=i_2[n]-i_2[n-1] \quad (1)$$

From $del1[n]$, an increase and a decrease in secondary current can be found. The second-order difference $del2[n]$ and the third-order difference $del3[n]$ can be calculated using the following Equations.

$$del2[n]=del1[n]-del1[n-1]$$

$$del3[n]=del2[n]-del2[n-1] \quad (2)$$

From $del2[n]$, an increase and a decrease in $del1[n]$ can be found, and whether the shape of secondary current is convex or concave can be found. Furthermore, from $del3[n]$, the amount of increase of $del2[n]$ can be found.

In this case, the case where $del2[n]<0$ means that $del1[n]$ is in a decreasing state. That is, the case where $del2[n]<0$ means that the amount of increase of $i_2$ decreases. The case where $del2[n]<0$ and the magnitude of $del2[n]$ is large means that $del1[n]$ is in a significant decreasing state and the amount of decrease of $i_2$ is rapidly increasing. That is, the case means that secondary current is rapidly decreasing, and can be determined to be the moment when the beginning or end of saturation occurs.

Since saturation varies in degree, it is problematic to simply estimate the magnetic flux at the time of saturation to be the magnetic flux at a saturation point. Accordingly, in order to precisely determine a saturation point, it is preferable to employ $del3[n]$ and determine the moment when $del3[n]$ is smaller than a critical value to be the point of the beginning or end of saturation.

For example, when the critical value is set to $-0.0015$, the moment when the value of $del3[n]$ first reaches $-0.0015$ or less, that is, when the value of $del3[n]<-0.0015$, can be determined to be the point of the beginning of saturation. Meanwhile, the moment when the value of $del3[n]$ second reaches $-0.0015$ or less can be determined to be the point of the end of saturation. The saturated section of a current transformer can be detected by detecting the points of the beginning and end of saturation using the above-described method.

In the meantime, current generated at the time of the fault of a power system can be assumed to be a combination of a DC offset component, which attenuates exponentially, a fundamental wave component and harmonic wave components, so that the current can be represented using an AutoRegressive (AR) model at step S303. That is, the secondary current distorted at the time of saturation of the current transformer can be estimated using the AR model.

An AR model refers to the model in which time series data are explained by previous values. In other words, if $$Y(k)=a_1y(k-1)+a_2y(k-2)+\ldots+a_py(k-p) \quad (3)$$

, the current value y(k) is influenced by the previous value (k-1) by $a_1$ and the previous value (k-2) by $a_2$. The model in which previous values up to (k-p) influence y(k) is referred to as a p-th-order AR model, and is expressed as AR(p). The above description can be arranged and expressed by the following Equation 4, $$y(k) = \sum_{j=1}^{p} a_j y(k-j)$$ (4)

where y(k) is a signal that is desired to be modeled, $a_j$ is the AR coefficient of an j-th term, and p is the order of the AR model.

The current signal generated at the fault of a power system is assumed to be a combination of a DC offset component, which decreases exponentially, and a sine wave component, and then can be expressed by the following Equation 5, $$i(t) = x_0(t) + \sum_{n=1}^{m} x_n(t)$$ (5)
$$= C_0 \exp^{-t/\tau} + \sum_{n=1}^{m} C_n \sin(n\omega t + \phi_n)$$

where $\tau$ and $C_0$ are the time constant and magnitude of the DC component, $C_n$ and $\phi_n$ are the magnitude and phase angle of an n-th harmonic, m is the highest order of the harmonic component, and $\omega$ is the fundamental frequency of the system.

When difference approximation is performed on a time increment $\Delta t$ using a time interval $\Delta t=T$, the following Equation is obtained. x(t+T)−x(t)

$$x'(t) = \frac{x_n(t+T) - x_n(t-T)}{T}$$ (6)

From Equation 6, the following Equation can be inferred. x'(t+T)−x'(t)

$$x_n''(t) = \frac{x_n(t+T) - 2x(t) + x_n(t-T)}{T^2} = -(n\omega)^2 x_n(t)$$ (7)
$$x_n(t+T) - 2x(t) + x_n(t-T) = -(n\omega T)^2 x_n(t)$$
$$x_n(t+T) = (2 - (n\omega)^2) x_n(t) - x_n(t-T)$$

In this case, time can be expressed by t=kT, so that an n-th harmonic sine component can be expressed by the following AR(2) model based on Equation 7.

$$x_n[k+1] = (2-(n\omega T)^2) x_n[k] - x_n[k-1]$$ (8)

where T is a sampling interval. When Equation 8 is expressed by a matrix equation, there can be obtained the following equation, $$x_n^{k+1} = a_n x_n^k \quad (n \neq 0)$$ (9)

where $$x_n^{k+1} = \begin{pmatrix} x_n[k+1] \\ x_n[k] \end{pmatrix}, x_n^k = \begin{pmatrix} x_n[k] \\ x_n[k-1] \end{pmatrix},$$

$$a_n = \begin{pmatrix} 2 - (n\omega T)^2 & -1 \\ 1 & 0 \end{pmatrix}$$

In a similar manner, when the $x_0(t)$ of a DC offset component is expressed using the AR model, the following AR(1) can be obtained.

$$x_0(t) = C_0 \exp^{-t/\tau}$$ (10)
$$x_0[k+1] = (1-T/\tau) x_0[k]$$

When Equation 10 is expressed by a matrix, the following Equation 11 is obtained.

$$x_0^{k+1} = a_0 x_0^k$$ (11)

When time is assumed to be t=kT, the discrete time form of the current i(t) can be expressed by Equation 12, $$i[k] = x_0[k] + \sum_{n=1}^{m} x_n[k]$$ (12)
$$= C_0 \exp^{-kT/\tau} + \sum_{n=1}^{m} C_0 \sin\left(\frac{2\pi n}{N} k + \phi_n\right)$$

where T is a sampling interval and N is the number of samplings per period.

When i[k] is considered up to an m-th harmonic, the current signal i[t] can be expressed by a (2m+1)-th-order AR model, as expressed by the following equation, $$i[k+1] = \Phi^T(k)\theta$$ (13)

where $\Phi(k) = [i[k], i[k-1], \ldots, i[k-2m]]^T$ and $\theta = [\theta_1, \theta_2, \ldots, \eta_{2m+1}]^T$. Furthermore, i[k] is the current value sampled at present time, i[k−1] is the current value sampled one sampling interval before, i[k−2m] is the current value sampled 2m sampling intervals before, $\theta$ is the coefficient of the AR model, and m is an arbitrary natural number.

To estimate the secondary current of a saturated current transformer, the coefficient $\theta$ of the AR model, as expressed in Equation 13, should be obtained at step S307. To obtain the coefficient of the AR model, a method using the current data of the unsaturated section of a current transformer (hereinafter referred to as a "method A") and a method obtaining the time constant of equivalent power behind the installation point of a relay while assuming it to be the time constant of a DC offset component (hereinafter referred to as a "method B") can be used.

The estimation of an AR coefficient using the method A is described first.

In the current signal modeled as described in Equation 13, $\Phi(k)$ is a matrix with sampled current values being arranged as elements, and $\theta$ is the coefficient of the AR model and the value to be obtained. To obtain 2m+1 element $\theta$ values, $L \geq 2m+1$ equations should be used. Accordingly, at least L+2m+1 current samples obtained from the occurrence of a fault to the beginning of the saturation of a current transformer or after the end of the saturation of the current transformer (unsaturated section) are required. In the case where the current transformer is excessively saturated and required sample data cannot be obtained in the section ranging from the occurrence of a fault to the beginning of the saturation of a current transformer, a disadvantage occurs in that the transient error of the estimated secondary current of the current transformer becomes large. To make up for the above disadvantage, data obtained after the end of the saturation of the current transformer may be additionally used. In general, a relay is designed to start to operate within 1.5 cycles (25 ms) after the occurrence of a fault, and the excessive saturation of the current transformer ends before or after about 1 cycle (16.6 ms). Accordingly, it is determined that the method additionally using data obtained after the end of the saturation does not influence the operational speed of a relay but can improve the precision of a compensation algorithm.

For the above-described reasons, L+2m+1 or more current data are sampled from the unsaturated section of the current transformer at step S305. Based on the sampled current data, the following equations can be established.

$$i[k] = \Phi^T(k-1)\hat{\theta} \quad (14)$$

$$i[k-1] = \Phi^T(k-2)\hat{\theta}$$

$$i[k-2] = \Phi^T(k-3)\hat{\theta}$$

$$\vdots$$

$$\vdots$$

$$i[k-L+1] = \Phi^T(k-1)\hat{\theta}$$

Equation 14 can be expressed as the following Equation 15.

$$Y(k) = \Phi(k)\hat{\theta} \quad (15)$$

where $Y(k) = [i[k], i[k-1] \ldots, i[k-L+1]]^T$, $\Phi(k) = [\Phi^T(k-1), \Phi^T(k-2), \ldots, \Phi^T(k-L)]^T$, $\hat{\theta} = [\theta_1, \theta_2, \ldots, \theta_{2m+1}]^T$, and L is a natural number. Accordingly, using a least square method, the AR coefficient can be obtained as follows.

$$\hat{\theta}(k) = [\Phi^T(k)\Phi(k)]^{-1}\Phi^T(k)Y(k) \quad (16)$$

The method using an AR coefficient using a least square method is advantageous in that the current signal of a saturated section can be estimated using only the current data of an unsaturated section. However, since $L \geq 2m+1$ equations should be used to obtain 2m+1 AR coefficients, at least L+2m+1 current samples obtained from the occurrence of a fault to the beginning of the saturation of a current transformer or in an unsaturated section after the end of the saturation of a current transformer are required. In the case where a current transformer is excessively saturated and a required number of samples cannot be obtained, the transient error of the estimated secondary current of the current transformer becomes large.

The estimation of an AR coefficient using the method B is described below.

When it is assumed that current signal i(t) is the sum of a DC offset component decreasing exponentially, a fundamental wave component and second to m-th harmonic sine components, $$i(t) = C_0 \exp^{-t/\tau} + \sum_{n=1}^{m} C_n \sin(n\omega t + \theta_n) \quad (17)$$

The AR model of the n-th harmonic sine component can be expressed by the following equation.

$$x_n(t) = C_n \sin(n\omega t + \theta_n) \quad (18)$$

$$x_n[k+1] = (2 - (n\omega T)^2)x_n[k] - x_n[k-1]$$

The AR model of the DC offset component decreasing exponentially is expressed by the following equation.

$$x_0(t) = C_0 \exp^{-t/\tau} \quad (19)$$

$$x_0[k+1] = (1 - T/\tau)x_0[k]$$

As understood from Equations 18 and 19, the AR coefficient of the n-th harmonic sine component is expressed by the frequency nω and the sampling interval T, and the coefficient of the DC component is expressed by the sampling interval T and the time constant τ. Since, of these three values, only the time constant τ of the DC component is unknown, the AR coefficient θ of the current signal can be previously calculated with the time constant being assumed to be a constant value. As a result, the number of pieces of data required for the estimation of current in a saturated section is only 2m+1 that is identical to the order of the AR model at step S305.

$$i[k+1] = \Phi^T(k)\theta \quad (20)$$

where $\Phi(k) = [i[k], i[k-1], \ldots, i[k-2m]]^T$ and $\theta = [\theta_1, \theta_2, \ldots, \theta_{2m+1}]^T$. The method of previously calculating the coefficient of the AR model is used to minimize the number of samples required for the estimation of a current signal, so that fault current is assumed to be composed of a DC offset component and a fundamental wave component and is modeled into a third-order AR model.

The secondary current of a current transformer distorted due to the saturation of the current transformer can be compensated for by estimating the coefficient of the AR model at the time of the saturation of the current transformer according to the above-described method at step S307 and estimating normal secondary current, that is, secondary current in conformity with a current transformation ratio, at step S309.

Figure 6:
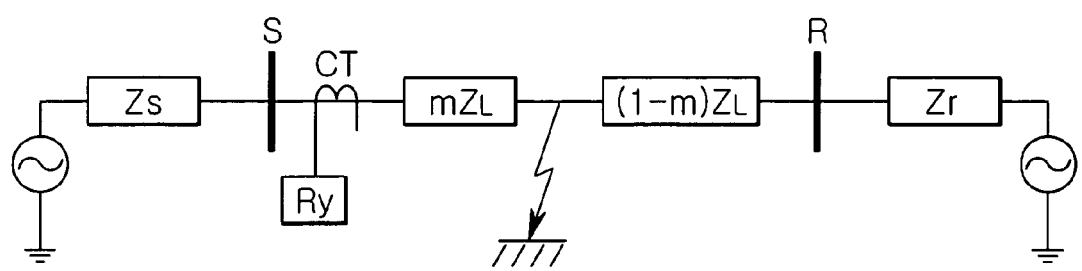
FIG. 6 is a schematic diagram showing an example of a model system that is used to verify the method of compensating for the distorted secondary current of a current transformer in accordance with the present invention.

FIG. 6 is a schematic diagram showing an example of a model system that is used to verify the method of compensating for the distorted secondary current of a current transformer in accordance with the present invention. Referring to FIG. 6, to verify the method of compensating for the distorted secondary current of a current transformer in accordance with the present invention, a 345 KV, 100 km aerial transmission line was simulated using an ElectroMegnetic Transient Program (EMTP). Data input to the EMTP is as shown in Table 1.

TABLE 1

| Type | R | L | C |
|------|---|---|---|
| Zs0 | 1.5870 [Ω] | 31.554 [mH] | |
| Zs1 | 0.7888 [Ω] | 15.777 [mH] | |
| Zs2 | 0.7888 [Ω] | 15.777 [mH] | |
| Zr0 | 5.5847 [Ω] | 82.664 [mH] | |
| Zr1 | 2.6662 [Ω] | 42.350 [mH] | |
| Zr2 | 2.6662 [Ω] | 42.350 [mH] | |
| $Z_L0$ | 0.2511 [Ω/km] | 2.7058 [mH/km] | 0.0045 [μF/km] |
| $Z_L1$ | 0.0345 [Ω/km] | 0.9724 [mH/km] | 0.0117 [μF/km] |
| $Z_L2$ | 0.0345 [Ω/km] | 0.9724 [mH/km] | 0.0117 [μF/km] |

A contingency was an A-phase ground fault occurring at a location 2 km away from an S bus, and 64 samplings were conducted per period. A voltage phase angle 0° fault, which is one of the principal causes of the saturation of a current transformer and exhibits the maximum DC offset component, was simulated while remanent magnetic flux varies between −80% and 80%.

In order to simulate remanent magnetic flux, a method described in the thesis entitled "Experimental Evaluation of EMTP-Based Current Transformer Models for Protective Relay Transient Study" (M. Kezunovic, L. Kojovic, A. Abur, C. W. Fromen, F. Phillips, IEEE Trans. On PWRD, Vol. 9, No. 1, pp. 405–413, January 1994) was used for Current Transformer (CT) modeling, and a 3.42Ω resistance load was connected to C400 CT (2000:5, R=20.61Ω). Hysteresis data was prepared using HYSDAT, that is, an EMTP auxiliary routine, and a saturation point was a point of 2.047 A and 1.512 Vs.

Furthermore, to evaluate the performance of the method of compensating for the distorted secondary current of a current transformer in accordance with the present invention, error was calculated using a transient error arithmetic expression, such as the following Equation, $$\text{transient error}(\%) = \frac{K_n \cdot i_2(t) - i_1(t)}{\sqrt{2} \cdot I_{psc}} \times 100\% \quad (21)$$

where $I_{psc}$ is short circuit current, $K_n$ is a current transformation ratio, $i_1(t)$ is the primary current of the current transformer, and $i_2(t)$ is the secondary current of the current transformer.

Figure 7:
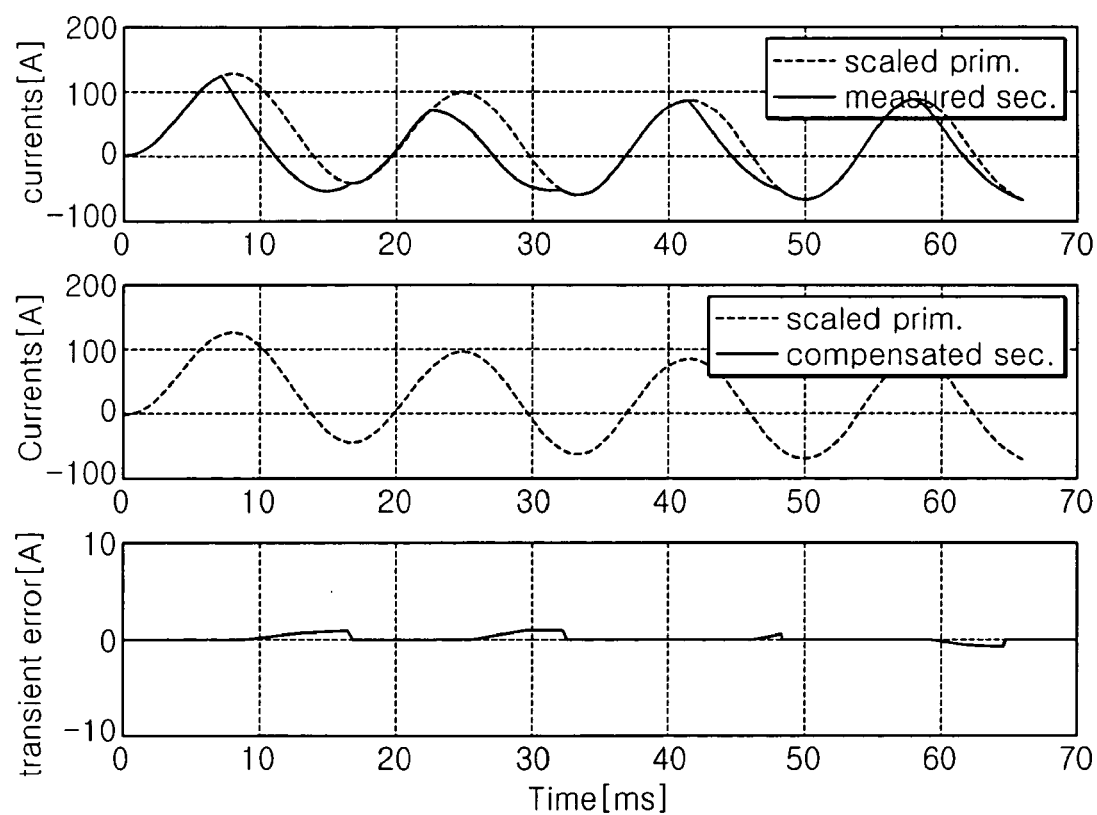
FIG. 7 depicts graphs showing an example of the result of compensation for distorted secondary current using a method A in the case of performing modeling using a fifth-order AR model.

FIG. 7 depicts graphs showing an example of the result of compensation for the distorted secondary current using the method A in the case of performing modeling using a fifth-order AR model. In this case, remanent magnetic flux was set to 1%, and a fault making angle was assumed to be 0°.

The first graph shows the primary current of the current transformer converted into secondary current, and the measured secondary current of the current transformer. The second graph shows the secondary current compensated for by the method A. The third graph shows the transient error of the compensated secondary current, from which it can be understood that the maximum transient error falls within 1.0%.

Figure 8:
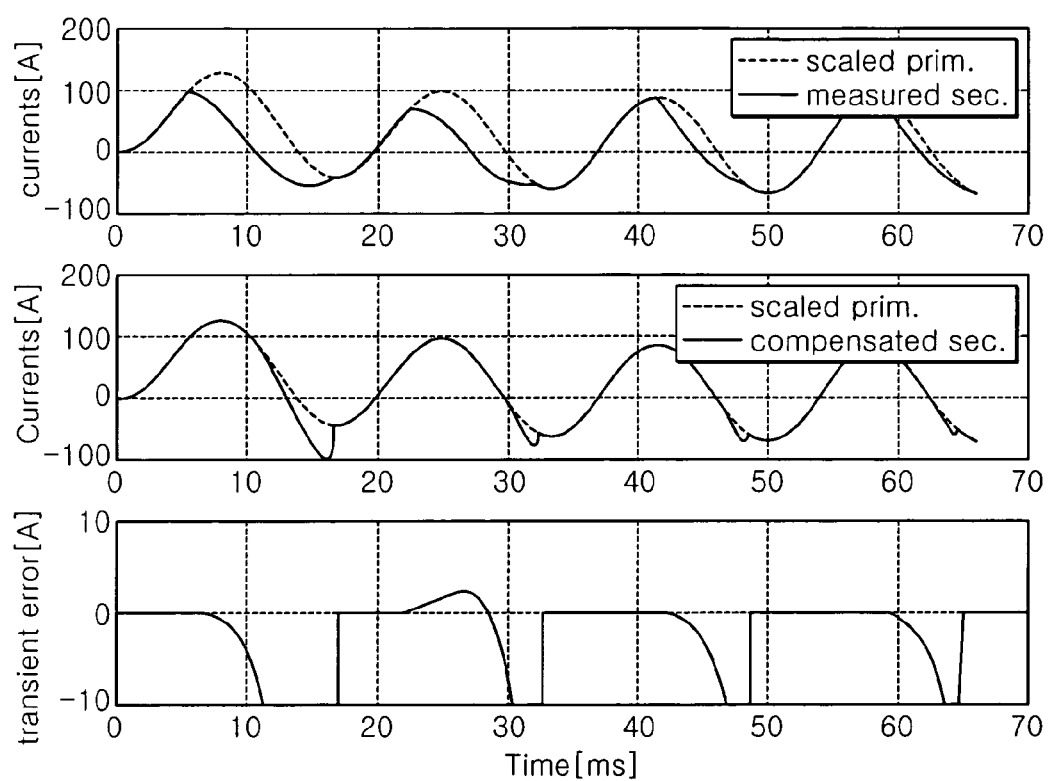
FIG. 8 depicts graphs showing the transient error in the case where the method A is used and a required number of pieces of sample data is not obtained.

The method A is advantageous in that the current of a saturated section can be compensated for using only the current data of an unsaturated section. However, in the method A, fault current is assumed to be modeled into the fifth-order AR model and eight or more equations are used, the number of samples required for the estimation of the AR coefficient is at least 13. In the case where the current transformer is excessively saturated and required sample data cannot be obtained, the transient error of the estimated secondary current of the current transformer becomes large, an example of which is illustrated in FIG. 8.

In the case of the method B, the AR coefficient is previously calculated, so that the number of pieces of data required for the estimation of the current of the saturated section is 2m+1 that is identical to the order of the AR model.

Figure 9:
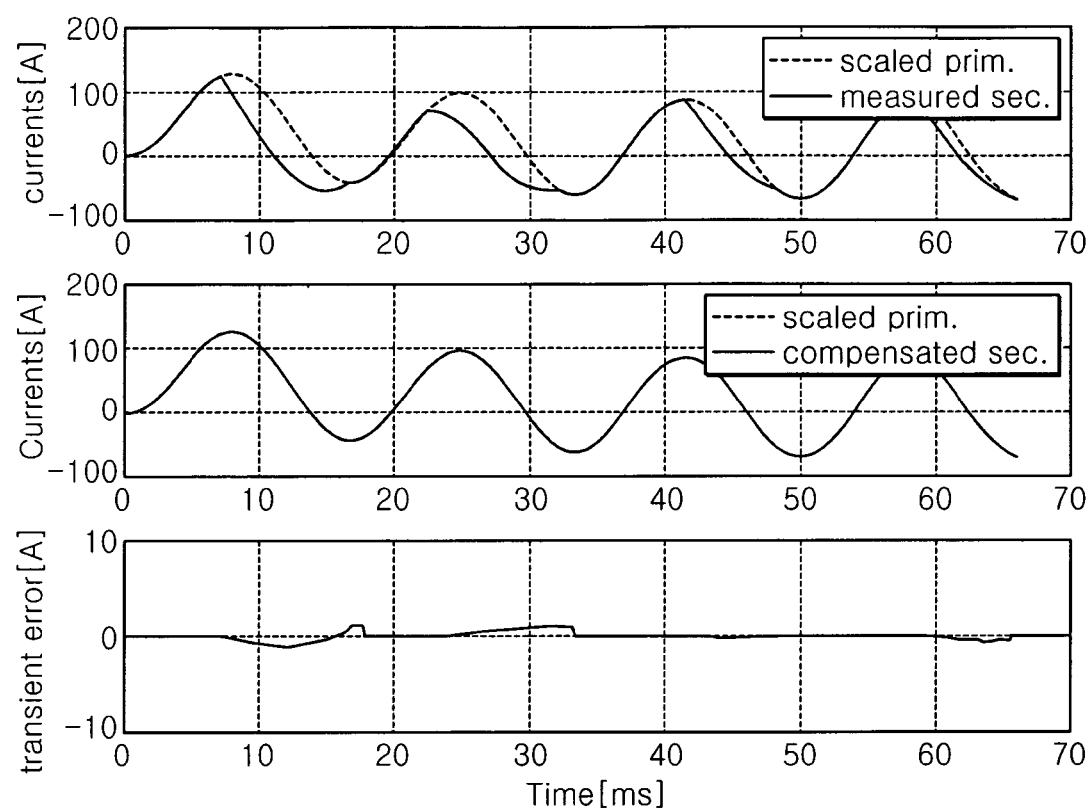
FIG. 9 depicts graphs showing an example of the result of compensation for distorted secondary current using a method B in the case of performing modeling using the fifth-order AR model.
Figure 10:
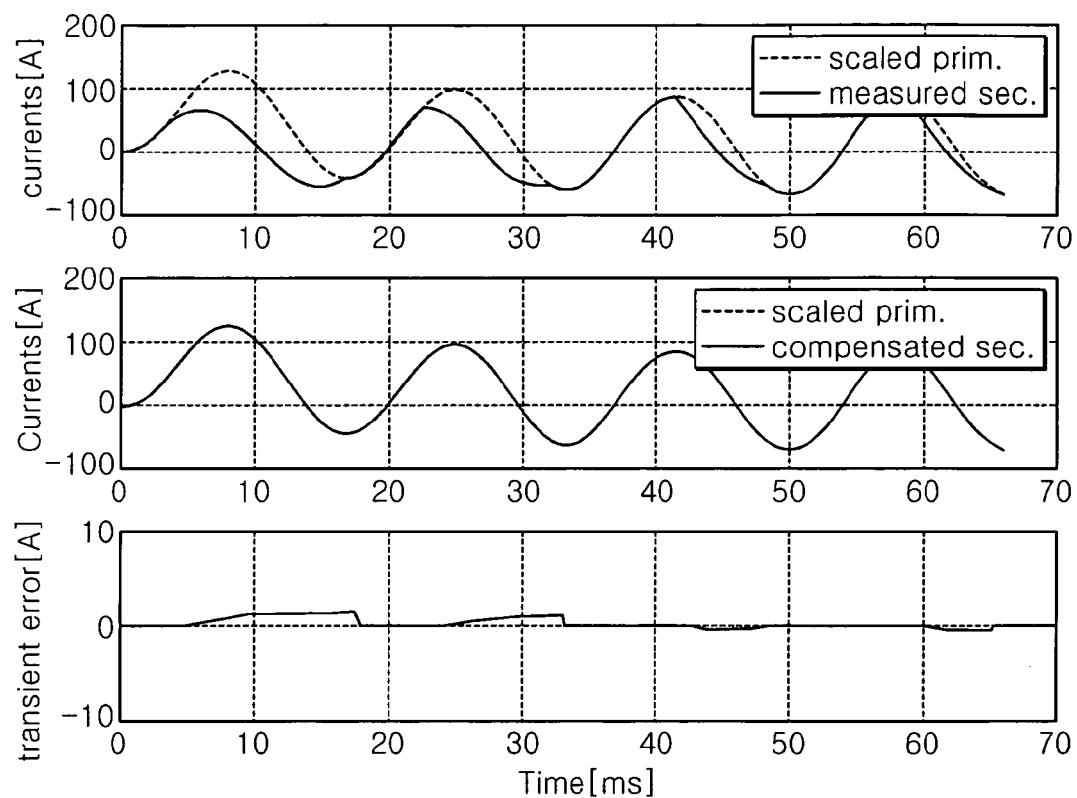
FIG. 10 depicts graphs showing another example of the result of compensation for distorted secondary current using the method B in the case of performing modeling using the fifth-order AR model.

FIG. 9 depicts graphs showing an example of the result of compensation for distorted secondary current using the method B in the case of performing modeling using the fifth-order AR model. FIG. 10 depicts graphs showing another example of the result of compensation for distorted secondary current using the method B in the case of performing modeling using the fifth-order AR model. That is, FIGS. 9 and 10 show compensation results using the method B in the case where remanent magnetic flux is 0% and about 80%, respectively. From Table 2 that shows the maximum transient error, it can be understood that the maximum error falls within 1.7% and the secondary current of the current transformer can be precisely estimated in conformity with the current transformation ratio even when the current transformer is excessively saturated.

TABLE 2

Fault distance: 0.02 pu, Fault making angle: 0°

| Remanent magnetic flux [%] | 0 | 20 | 40 | 60 | 80 | −20 | −40 | −60 | −80 |
|---|---|---|---|---|---|---|---|---|---|
| Maximum error [%] | −1.30 | 1.62 | 1.63 | 1.66 | 1.44 | 1.34 | 1.11 | 1.01 | 1.03 |

In the method B, the AR coefficient is calculated with the time constant of the DC component being assumed to be a specific value, so that an error occurs in the case where the time constant of the DC component of the fault current is different from the assumed value. Tables 3 and 4 show the evaluation of the performance of the method of compensating for the distorted secondary current of the current transformer in the above-described case.

TABLE 3

Remanent magnetic flux: 60 [%], Fault making angle: 0°

| Fault distance [pu] | 0.02 | 0.2 | 0.4 | 0.6 | 0.8 |
|---|---|---|---|---|---|
| Maximum error [%] | 1.66 | 1.79 | −0.99 | −1.13 | 0.55 |

TABLE 4

| | | Variation in time constant of power [%] | | | | |
|---|---|---|---|---|---|---|
| Classification | | −20 | −10 | 0 | 10 | 20 |
| Remanent magnetic flux [%] | −80 | −0.89 | −0.80 | 1.03 | 1.29 | 1.81 |
| | −60 | −0.80 | −1.10 | 1.01 | 1.39 | 1.83 |
| | −40 | −1.20 | −0.83 | 1.11 | 1.88 | 2.32 |
| | −20 | −1.15 | −0.98 | 1.34 | 2.03 | 2.87 |
| | 0 | −1.98 | −1.40 | −1.30 | 1.89 | 2.73 |
| | 20 | −1.31 | −0.94 | 1.62 | 2.52 | 3.30 |
| | 40 | −1.41 | −0.94 | 1.63 | 2.55 | 3.43 |
| | 60 | −1.68 | −0.95 | 1.66 | 2.58 | 3.47 |
| | 80 | 3.24 | 0.54 | 1.44 | 2.34 | 3.24 |

Table 3 shows the result of compensation using the method B in the case where remanent magnetic flux is 60% and a fault occurs at a distance of 0~0.8 [pu]. The maximum transient error falls within 1.8%, and it can be understood that the secondary current can be estimated in conformity with the current transformation ratio without the influence of the variation of the fault distance.

In the method of compensating for the distorted secondary current of the current transformer in accordance with the present invention, the time constant of power assumed to be the time constant of the DC component is the value that is calculated using Thevenin equivalent impedance behind an installation point and that varies depending on the variation in the condition of a back system.

Table 4 shows the maximum transient error of the method B depending on the variation of power impedance in the case where the fault distance is 0.02 [pu] and the fault making angle is 0°. In this case, to analyze the influence of the method B, tests were conducted while the time constant of power were varying between −20% and 20%. The maximum transient error falls within 4%, and it can be understood that the secondary current can be estimated in conformity with the current transformation ratio without the influence of variation in the time constant of back power.

In accordance with the present invention, the method of compensating the distorted secondary current of a current transformer does not require current transformer data to compensate for the secondary current distorted due to the saturation of the current transformer, but uses only sampled current data, so that it is possible to compensate for the distorted secondary current of the current transformer in the case where remanent magnetic flux exists at an early stage as well as in the case where remanent magnetic flux does not exist in the early state.

Furthermore, in accordance with the present invention, it is possible to estimate the secondary current of the current transformer without the particular influence of the maximum transient error even in the case where the current transformer is excessively saturated.

Furthermore, in accordance with the present invention, the distorted secondary current of the current transformer can be selectively estimated according to the number of pieces of current data sampled in the unsaturated section of the current transformer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of compensating for distorted secondary current of a current transformer, the method comprising the steps of:
    (a) detecting a saturated section of the current transformer;
    (b) representing fault current generated during a fault in a power system using an AutoRegressive (AR) model, with the fault current being assumed to be a combination of a Direct Current (DC) offset component, a fundamental wave component and harmonic components; and
    (c) estimating coefficients of the AR model and compensating precisely the secondary current during saturation of the current transformer, based on the secondary current data sampled in the unsaturated section.

2. The method as set forth in claim 1, wherein step (a) detects the saturated section of the current transformer using a wavelet transform, and is performed in such a way as to detect the saturated section of the current transformer using high-pass filter output after passing the secondary current of the current transformer through a filter bank.

3. The method as set forth in claim 1, wherein step (a) detects the saturated section of the current transformer using a second- or higher-order difference function of the current signal of the current transformer.

4. The method as set forth in claim 1, wherein the AR model is expressed in the following (2m+1)-th-order form in consideration of a DC offset component decreasing exponentially, a fundamental wave component and second to m-th harmonic components, $$i[k+1]=\Phi^T(k)\theta,$$

where $\Phi(k)=[i[k],i[k-1], \ldots ,i[k-2m]]^T$, $\theta=[\theta_1,\theta_2,\ldots,\theta_{2m+1}]^T$, i[k] is the current value sampled at present time, i[k−1] is the current value sampled one sampling inverval before, i[k−2m] is the current value sampled 2m sampling invervals before, $\theta$ is the coefficient of the AR model, and m is an arbitrary natural number.

5. The method as set forth in claim 1, wherein the plurality of pieces of sampled secondary data includes values sampled after the saturation of the current transformer.

6. The method as set forth in claim 5, wherein the AR model allows the following equation to be derived therefrom, $$Y(k)=\Phi(k)\hat\theta,$$

where $Y(k)=[i[k],i[k-1],\ldots,i[k-L+1]]^T$, $\Phi(k)=[\Phi^T(k-1), \Phi^T(k-2), \ldots, \Phi^T(k-L)]^T$, $\hat\theta=[\theta_1,\theta_2,\ldots,\theta_{2m+1}]^T$, and L is a natural number.

7. The method as set forth in claim 6, wherein the coefficient of the AR model is calculated using the following equation, $$\hat\theta(k)=[\Phi^T(k)\Phi(k)]^{-1}\Phi^T(k)Y(k).$$

8. The method as set forth in claim 1, wherein an n-th harmonic sine component of the AR model is expressed by the following equation, $$x_n[k+1]=(2-(n\omega T)^2)x_n[k]-x_n[k-1]$$

where $n\omega$ is a frequency, T is a sampling interval, $x_n[k]$ is the current value of an n-th harmonic sine component sampled at present time, and $x_n[k-1]$ is the current value of an n-th harmonic sine component sampled one sampling interval before.

9. The method as set forth in claim 8, wherein the DC offset component of the AR model, which decreases exponentially, is expressed by the following Equation, $$x_0[k+1]=(1-T/\tau)x_0[k]$$

where $\tau$ is a time constant.

10. The method as set forth in claim 8, wherein the coefficient of the AR model is previously calculated using the frequency $n\omega$, the sampling interval T and an equivalent power time constant behind an installation point of a relay.

11. The method as set forth in claim 9, wherein the coefficient of the AR model is previously calculated using the frequency $n\omega$, the sampling interval T and an equivalent power time constant behind an installation point of a relay.

12. The method as set forth in claim 2, wherein the AR model is expressed in the following (2m+1)-th-order form in consideration of a DC offset component decreasing exponentially, a fundamental wave component and second to m-th harmonic components, $$i[k+1]=\Phi^T(k)\theta,$$

where $\Phi(k)=[i[k],i[k-1], \ldots ,i[k-2m]]^T$, $\theta=[\theta_1,\theta_2,\ldots,\theta_{2m+1}]^T$, i[k] is the current value sampled at present time, i[k−1] is the current value sampled one sampling interval before, i[k−2m] is the current value sampled 2m sampling intervals before, θ is the coefficient of the AR model, and m is an arbitrary natural number.

13. The method as set forth in claim 3, wherein the AR model is expressed in the following (2m+1)-th-order form in consideration of a DC offset component decreasing exponentially, a fundamental wave component and second to m-th harmonic components, $$i[k+1] = \Phi^T(k)\theta,$$

where $\Phi(k)=[i[k],i[k-1],\ldots,i[k-2m]]^T$, $\theta=[\theta_1,\theta_2,\ldots,\theta_{2m+1}]^T$, i[k] is the current value sampled at present time, i[k−1] is the current value sampled one sampling interval before, i[k−2m] is the current value sampled 2m sampling intervals before, θ is the coefficient of the AR model, and m is an arbitrary natural number.

14. The method as set forth in claim 2, wherein an n-th harmonic sine component of the AR model is expressed by the following Equation, $$x_n[k+1] = (2-(n\omega T)^2)x_n[k] - x_n[k-1]$$

where nω is a frequency, T is a sampling interval, $x_n[k]$ is the current value of an n-th harmonic sine component sampled at present time, and $x_n[k-1]$ is the current value of an n-th harmonic sine component sampled one sampling interval before.

15. The method as set forth in claim 14, wherein the DC offset component of the AR model, which decreases exponentially, is expressed by the following equation, $$i\ x_0[k+1] = (1-T/\tau)x_0[k],$$

where τ is a time constant.

16. The method as set forth in claim 15, wherein the coefficient of the AR model is previously calculated using the frequency nω, the sampling interval T and an equivalent power time constant behind an installation point of a relay.

17. The method as set forth in claim 3, wherein an n-th harmonic sine component of the AR model is expressed by the following equation, $$x_n[k+1] = (2-(n\omega T)^2)x_n[k] - x_n[k-1],$$

where nω is a frequency, T is a sampling interval, $x_n[k]$ is the current value of an n-th harmonic sine component sampled at present time, and $x_n[k-1]$ is the current value of an n-th harmonic sine component sampled one sampling interval before.

18. The method as set forth in claim 17, wherein the DC offset component of the AR model, which decreases exponentially, is expressed by the following equation, $$x_0[k+1] = (1-T/\tau)x_0[k],$$

where τ is a time constant.

19. The method as set forth in claim 18, wherein the coefficient of the AR model is previously calculated using the frequency nω, the sampling interval T and an equivalent power time constant behind an installation point of a relay.

* * * * *

UNITED STATES PATENT AND TRADEMARK OFFICE
CERTIFICATE OF CORRECTION

PATENT NO. : 7,127,364 B2 Page 1 of 1
APPLICATION NO. : 11/010747
DATED : October 24, 2006
INVENTOR(S) : Kang et al.

It is certified that error appears in the above-identified patent and that said Letters Patent is hereby corrected as shown below:

<u>Column 2</u>, line 51, "and harmonic component" should read
-- and harmonic components --

<u>Column 3</u>, line 30, "Tis" should read -- T is --

<u>Column 7</u>, line 35, delete the equation "$x(t+T)-x(t)$"

<u>Column 7</u>, line 41, delete the equation "$x'(t+T)-x'(t)$"

<u>Column 8</u>, line 14, "by a matrix" should read -- by a matrix equation --

Signed and Sealed this

Tenth Day of April, 2007

JON W. DUDAS
*Director of the United States Patent and Trademark Office*